(12) United States Patent
Fuji et al.

(10) Patent No.: US 12,103,790 B2
(45) Date of Patent: Oct. 1, 2024

(54) FLOTATION CONVEYANCE APPARATUS AND LASER PROCESSING APPARATUS

(71) Applicant: JSW AKTINA SYSTEM CO., LTD., Yokohama (JP)

(72) Inventors: Takahiro Fuji, Tokyo (JP); Yoshihiro Yamaguchi, Tokyo (JP); Takashi Nagai, Tokyo (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 351 days.

(21) Appl. No.: 17/149,103

(22) Filed: Jan. 14, 2021

(65) Prior Publication Data
US 2021/0252635 A1    Aug. 19, 2021

(30) Foreign Application Priority Data
Feb. 13, 2020  (JP) ................ 2020-022269

(51) Int. Cl.
*B23K 26/08*     (2014.01)
*B23K 26/50*     (2014.01)
*B65G 49/06*     (2006.01)
*B65G 51/03*     (2006.01)
*H01L 21/67*     (2006.01)
*H01L 21/677*    (2006.01)

(52) U.S. Cl.
CPC ............ *B65G 51/03* (2013.01); *B23K 26/083* (2013.01); *B23K 26/50* (2015.10); *B65G 49/065* (2013.01); *H01L 21/67115* (2013.01); *H01L 21/67784* (2013.01)

(58) Field of Classification Search
CPC ...... B65G 51/03; B65G 49/065; B65G 51/00; B23K 26/083; B23K 26/50; H01L 21/67115; H01L 21/67784
See application file for complete search history.

(56) References Cited

U.S. PATENT DOCUMENTS

| 6,336,775 | B1 | 1/2002 | Morita et al. | |
| 8,191,227 | B2* | 6/2012 | Brackley | B65G 49/065 |
| | | | | 269/21 |
| 2003/0196605 | A1* | 10/2003 | Park | B65G 49/061 |
| | | | | 118/728 |

(Continued)

FOREIGN PATENT DOCUMENTS

| JP | 48-43394 U | 6/1973 |
| JP | 1-89533 U | 6/1989 |

(Continued)

OTHER PUBLICATIONS iec-corp.com/pdfs/rld_catalog.pdf, Oct. 2019 (Year: 2019).*

(Continued)

*Primary Examiner* — Justin C Dodson
(74) *Attorney, Agent, or Firm* — Sughrue Mion, PLLC

(57) ABSTRACT

A flotation conveyance apparatus according to an embodiment conveys a substrate while floating the substrate by ejecting a gas to a lower surface of the substrate. The flotation conveyance apparatus includes an upper plate disposed on the substrate side including a plurality of ejecting ports for ejecting the gas and a lower plate disposed under the upper plate. Flow-paths for supplying the gas to the plurality of ejecting ports are provided on at least one of the upper plate and the lower plate.

14 Claims, 11 Drawing Sheets

(56) References Cited

U.S. PATENT DOCUMENTS

| | | | |
|---|---|---|---|
| 2004/0109740 A1* | 6/2004 | Nilsen | F16B 37/061 |
| | | | 411/171 |
| 2008/0117551 A1 | 5/2008 | Brackley et al. | |
| 2011/0017711 A1* | 1/2011 | Nakada | B23K 26/10 |
| | | | 219/121.18 |
| 2019/0164798 A1 | 5/2019 | Suzuki | |
| 2020/0219724 A1 | 7/2020 | Suzuki et al. | |

FOREIGN PATENT DOCUMENTS

| | | | | |
|---|---|---|---|---|
| JP | 8-277536 A | 10/1996 | | |
| JP | 2000-118712 A | 4/2000 | | |
| JP | 2000-128346 A | 5/2000 | | |
| JP | 2010-510453 A | 4/2010 | | |
| JP | 2018-37449 A | 3/2018 | | |
| JP | 2019-41002 A | 3/2019 | | |
| JP | 2019-192681 A | 10/2019 | | |
| KR | 101187006 B1 * | 9/2012 | | B65G 51/03 |
| KR | 101307187 B1 * | 9/2013 | | B65G 51/03 |
| KR | 101402692 B1 * | 6/2014 | | B65G 51/03 |
| KR | 101517992 B1 * | 5/2015 | | |
| WO | WO-2018042808 A1 * | 3/2018 | | B23K 26/0006 |

OTHER PUBLICATIONS

WO-2018042808-A1 (Year: 2018).*
KR-101517992-B1 (Year: 2015).*
Japanese Office Action issued Sep. 19, 2023 in Application No. 2020-022269.
Communication dated Nov. 7, 2023, issued in Japanese Application No. 2020-022269.

* cited by examiner

FLOTATION CONVEYANCE APPARATUS AND LASER PROCESSING APPARATUS

INCORPORATION BY REFERENCE

This application is based upon and claims the benefit of priority from Japanese patent application No. 2020-022269, filed on Feb. 13, 2020, the disclosure of which is incorporated herein in its entirety by reference.

BACKGROUND

The present disclosure relates to a flotation conveyance apparatus and a laser processing apparatus. In particular, the present disclosure relates to a flotation conveyance apparatus and a laser processing apparatus that conveys a substrate while floating the substrate.

In a process of manufacturing a liquid crystal display panel, an organic EL panel, and so on, a flotation conveyance apparatus for conveying a substrate while floating the substrate is widely used, because the substrate to be used is large. Japanese Unexamined Patent Application Publication No. 2019-192681 discloses a technique relating to a flotation conveyance apparatus for floating and conveying a substrate by blowing a gas to the substrate.

SUMMARY

There is a problem that a flotation amount of a substrate varies in a flotation conveyance apparatus which conveys a substrate while floating the substrate. In particular, a laser processing apparatus for irradiating a substrate with a laser beam is desired to improve the flotation accuracy of the substrate, because the variation in the flotation amounts of the substrate greatly influences the quality of a film and the like on the laser-processed substrate.

Other problems and novel features will become apparent from the description in the present specification and the accompanying drawings.

An example aspect is a flotation conveyance apparatus for conveying a substrate while floating the substrate by ejecting a gas to a lower surface of the substrate, the flotation conveyance apparatus including: an upper plate disposed on the substrate side including a plurality of ejecting ports for ejecting the gas; and a lower plate disposed under the upper plate. Flow-paths for supplying the gas to the plurality of ejecting ports are provided on at least one of the upper plate and the lower plate.

A laser processing apparatus according to the example aspect includes the above flotation conveyance apparatus and a laser generation unit configured to generate a laser beam to be applied to the substrate.

According to the above aspect, it is possible to provide a flotation conveyance apparatus and a laser processing apparatus which can improve flotation accuracy of a substrate.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

Figure 1:
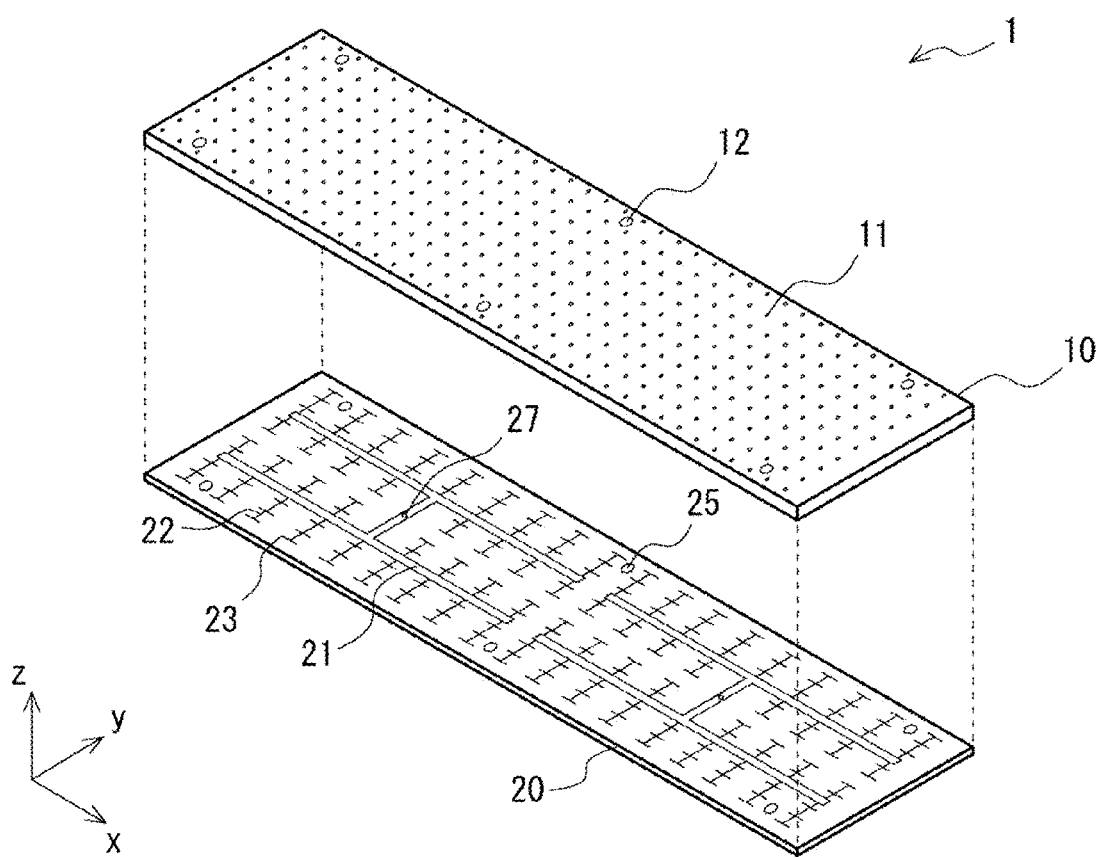
FIG. 1 is an exploded perspective view for explaining a flotation conveyance apparatus according to a first embodiment.
Figure 2:
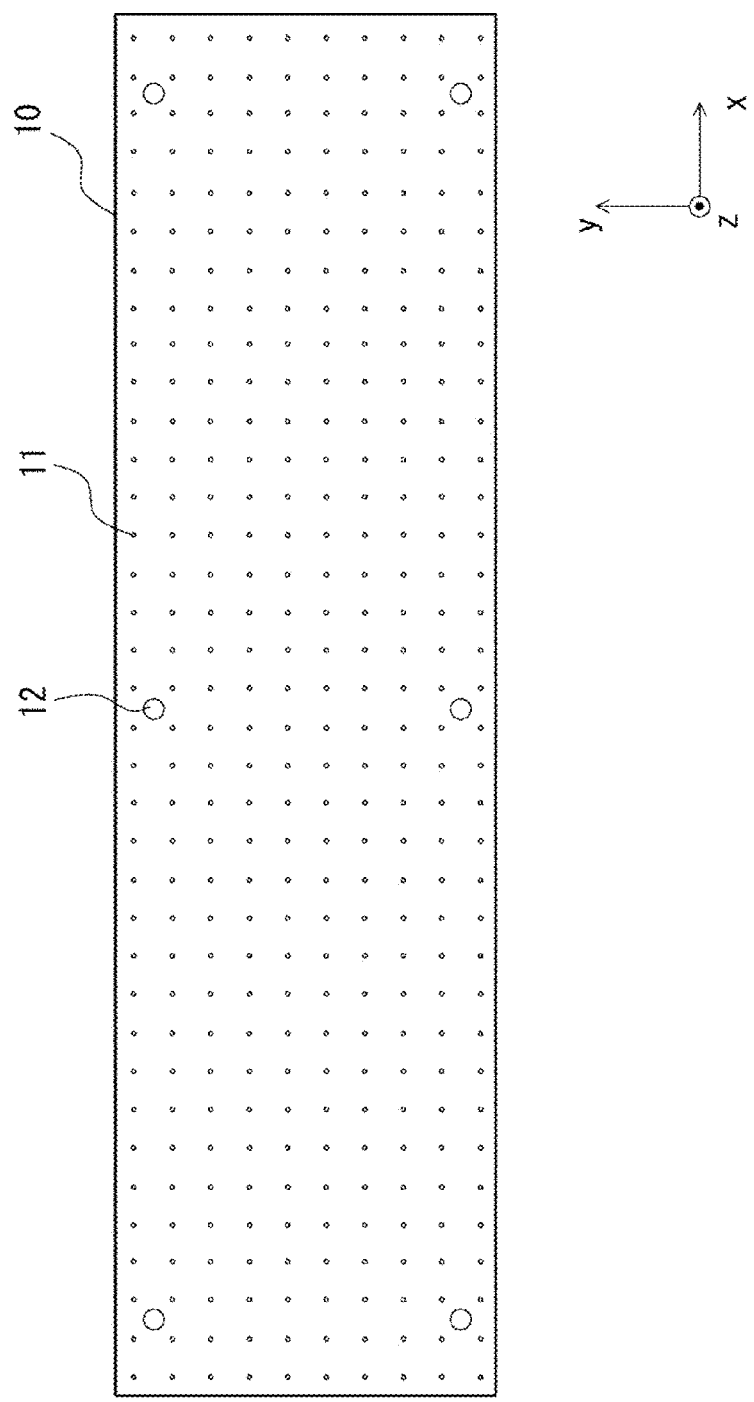
FIG. 2 is a top view for explaining the flotation conveyance apparatus according to the first embodiment.
Figure 3:
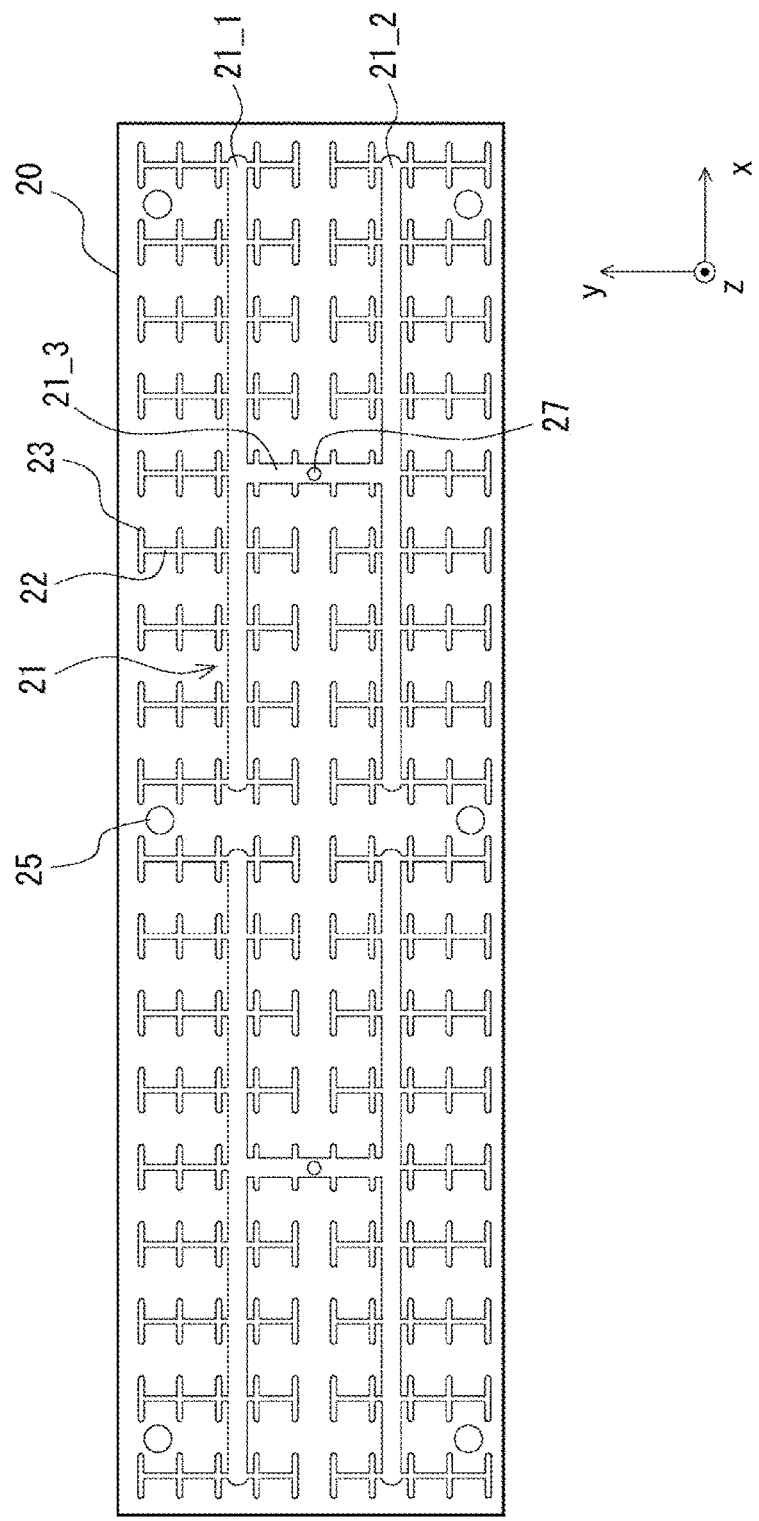
FIG. 3 is a top view of a lower plate of the flotation conveyance apparatus according to the first embodiment.
Figure 4:
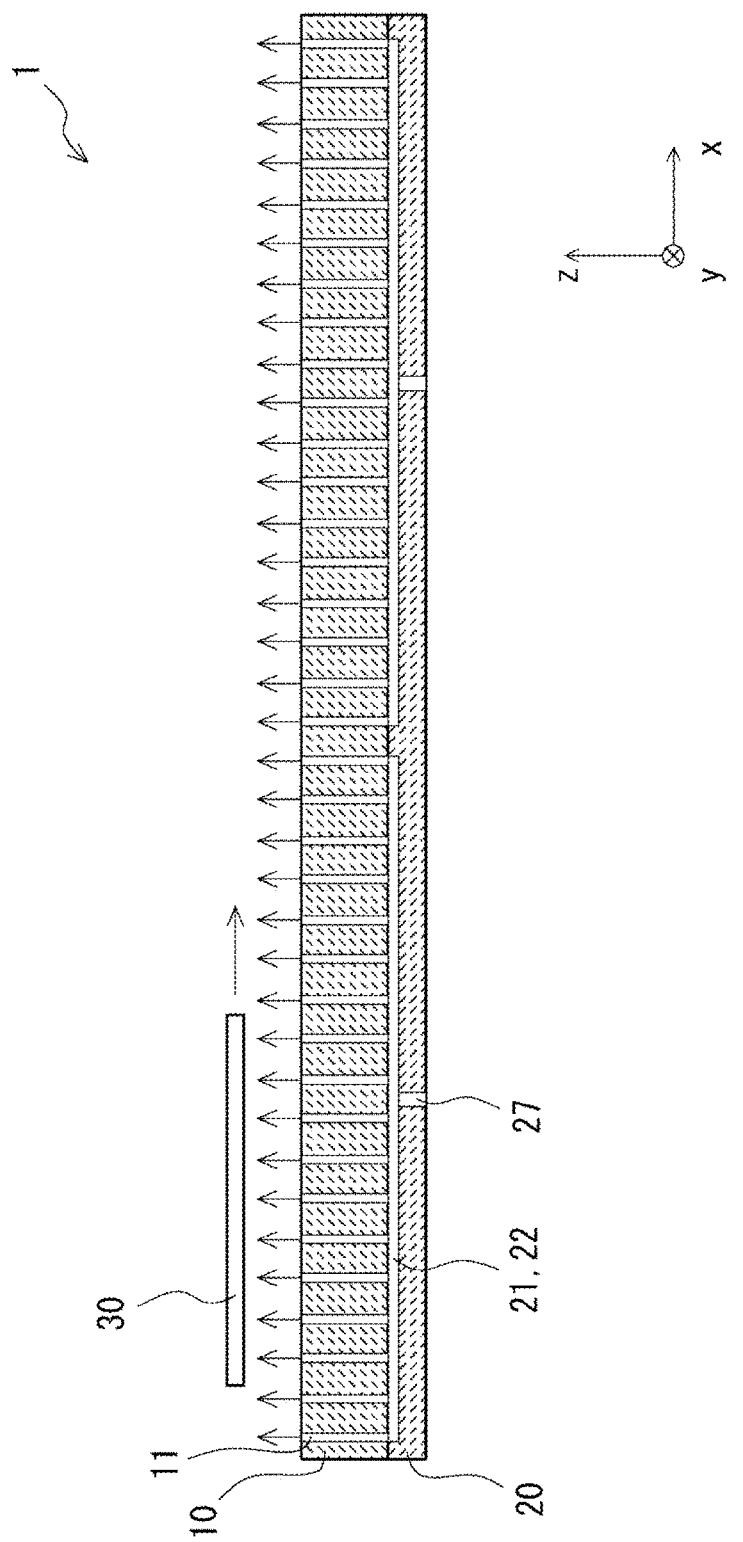
FIG. 4 is a cross-sectional view of the flotation conveyance apparatus according to the first embodiment.

Embodiments will be described below with reference to the drawings. FIG. 1 is an exploded perspective view for explaining a flotation conveyance apparatus according to the first embodiment. FIG. 2 is a top view for explaining the flotation conveyance apparatus according to the first embodiment. FIG. 3 is a top view of a lower plate of the flotation conveyance apparatus according to the first embodiment. FIG. 4 is a cross-sectional view of the flotation conveyance apparatus according to the first embodiment. As shown in FIG. 4, a flotation conveyance apparatus 1 according to this embodiment is an apparatus for conveying a substrate 30 in a conveyance direction (a positive direction of an x-axis) while floating the substrate 30 by ejecting a gas to a lower surface of the substrate 30. As shown in FIG. 1, the flotation conveyance apparatus 1 according to this embodiment includes an upper plate 10 and a lower plate 20. The upper plate 10 is disposed on an upper side of the flotation conveyance apparatus 1 (a positive side of a z-axis direction). The lower plate 20 is disposed under the upper plate 10 (a negative side of a z-axis direction). For example, the upper plate 10 and the lower plate 20 may be made of a metallic material such as an aluminum alloy which is optionally plated.

As shown in FIGS. 1 and 2, a plurality of ejecting ports 11 for ejecting a gas upward are provided in a surface of the upper plate 10. As shown in FIG. 4, the flotation conveyance apparatus 1 according to this embodiment ejects a gas from the plurality of ejecting ports 11 toward the positive side of the z-axis direction, and causes the ejected gas to collide with a lower surface of the substrate 30 to thereby float the substrate 30. By moving the substrate 30 in the conveyance direction (the positive direction of the x-axis) using conveying means (not shown), the substrate 30 can be conveyed in the conveyance direction while the substrate 30 is being floated.

In the example shown in FIG. 2, the plurality of ejecting ports 11 are regularly arranged at predetermined intervals in the x-axis direction and the y-axis direction. However, in this embodiment, the arrangement of the plurality of ejecting ports 11 is not limited to the arrangement shown in FIG. 2, and may be any arrangement. A plurality of penetrating holes 12 into which leveling bolts 42 (see FIG. 5), which will be described later, are to be inserted are formed near an outer periphery of the upper plate 10.

As shown in FIG. 1, the lower plate 20 is disposed under the upper plate 10. As shown in FIGS. 1 and 3, a surface of the lower plate 20 facing the upper plate 10 (i.e., the positive side of the z-axis direction) is provided with a plurality of flow-paths 21 and 22 for supplying the gas to the plurality of ejecting ports 11 of the upper plate 10.

Specifically, as shown in FIG. 3, the first flow-paths 21 and the second flow-paths 22 are provided on the surface of the lower plate 20. The first flow-paths 21 supply the gas supplied from the gas supply ports 27 to each of the positive side of the y-axis direction and the negative side of the y-axis direction of the lower plate 20. That is, the first flow-paths 21 include flow-paths 21_1 provided on the positive side of the y-axis direction of the lower plate 20, flow-paths 21_2 provided on the negative side of the y-axis direction of the lower plate 20, and flow-paths 21_3 for supplying the gas supplied from the gas supply ports 27 to each of the flow-paths 21_1 and the flow-paths 21_2.

The second flow-paths 22 supply the gas supplied from the gas supply ports 27 through the first flow-paths 21 to the plurality of ejecting ports 11 provided in the upper plate 10. Specifically, end parts of the second flow-path 22 on an upstream side are connected to the first flow-paths 21, and respective end parts 23 of the second flow-paths 22 on a downstream side are connected to the respective ejecting ports 11.

In the example shown in FIG. 3, the cross-sectional area of the first flow-path 21 is configured to be larger than that of the second flow-path 22. That is, since the first flow-paths 21 function as flow-paths for supplying the gas supplied from the gas supply ports 27 to each of the second flow-paths 22, the amount of the gas passing through the first flow-paths 21 is larger than the amount of the gas passing through the second flow-paths 22. Thus, by making the cross-sectional area of the first flow-paths 21 larger than that of the second flow-paths 22, the resistance of the flow-paths from the gas supply ports 27 to the ejecting ports 11 can be reduced. This reduces the pressure loss of the gas and enables the gas maintained at a pressure about the same as the pressure of the gas supplied to the gas supply ports 27 to be supplied to the ejecting ports 11.

The arrangement of the first flow-paths 21 and the second flow-paths 22 shown in FIG. 3 is an example, and in this embodiment, the arrangement of the first flow-paths 21 and the second flow-paths 22 may be freely determined. That is, the arrangement of the first flow-paths 21 and the second flow-paths 22 may be any arrangement as long as the first flow-paths 21 and the second flow-paths 22 are configured to supply the gas from the gas supply ports 27 to the ejecting ports 11 through the first flow-paths 21 and the second flow-paths 22.

Penetrating holes 25 into which the leveling bolts 42 (see FIG. 5), which will be described later, are to be inserted are formed near the outer periphery of the lower plate 20. The positions of the penetrating holes 25 in the lower plate 20 correspond to the positions of the penetrating holes 12 in the upper plate 10.

In this embodiment, the upper plate 10 and the lower plate 20 are fastened to each other using fastening bolts. For example, the upper plate 10 and the lower plate 20 may be fastened to each other using a plurality of fastening bolts 41 (FIG. 5) inserted from the lower plate 20 side.

As described above, the flotation conveyance apparatus 1 according to this embodiment supplies the gas supplied from the gas supply ports 27 to the ejecting ports 11 through the first flow-paths 21 and the second flow-paths 22. Thus, as shown in FIG. 4, the gas can be ejected from the plurality of ejecting ports 11 to the lower surface of the substrate 30 to thereby float the substrate 30. Although the substrate 30 is typically a glass substrate, the substrate 30 conveyed by the flotation conveyance apparatus 1 is not limited to a glass substrate.

Further, the flotation conveyance apparatus 1 according to this embodiment is composed of the two plates of the upper plate 10 and the lower plate 20. With such a configuration, it is possible to effectively prevent generation of a gap between contact surfaces of the upper plate 10 and the lower plate 20, and effectively prevent leakage of the gas from the contact surfaces of the upper plate 10 and the lower plate 20. It is thus possible to effectively prevent variations in the flow rate of the gas ejected from the plurality of ejecting ports 11, and variations in the flotation amount of the substrate (variations in the position of the substrate in the up-down direction). Therefore, the flotation accuracy of the substrate 30 can be improved.

For example, when three plates of the upper plate, the middle plate, and the lower plate are fastened to each other by fastening bolts, it is difficult to appropriately fasten the three plates, for example, because the positions of the plates may be shifted. Further, in the case of the flotation conveyance apparatus, fastening is required between the respective plates. Specifically, fastening is required in three ways between the upper plate and the middle plate, between the middle plate and the lower plate, and between the upper plate and the lower plate, because the gas passes through internal flow-paths. However, if the plates are fastened in three ways in this manner, the number of fastening bolts to be used becomes large and is not realistic. In addition, when a thin plate such as a gasket is sandwiched, it is not realistic to fasten three plates, because it is difficult to maintain the processing accuracy of the gasket.

On the other hand, the flotation conveyance apparatus 1 according to this embodiment is composed of two plates of the upper plate 10 and the lower plate 20. Therefore, the fastening by bolts functions sufficiently, and the generation of a gap in the contact surfaces of the upper plate 10 and the lower plate 20 can be effectively prevented. It thus possible to effectively prevent the leakage of the gas from the contact surface between the upper plate 10 and the lower plate 20.

Although an example in which the flow-paths 21 and 22 are formed on the lower plate has been described above, in the flotation conveyance apparatus 1 according to this embodiment, the flow-paths 21 and 22 may be formed on at least one of the upper plate 10 and the lower plate 20. Specifically, as described above, the flow-paths 21 and 22 may be formed only on the lower plate 20. Alternatively, the flow-paths 21 and 22 may be formed only on the upper plate 10. Further alternatively, the flow-paths 21 and 22 may be formed on both the upper plate 10 and the lower plate 20.

Figure 5:
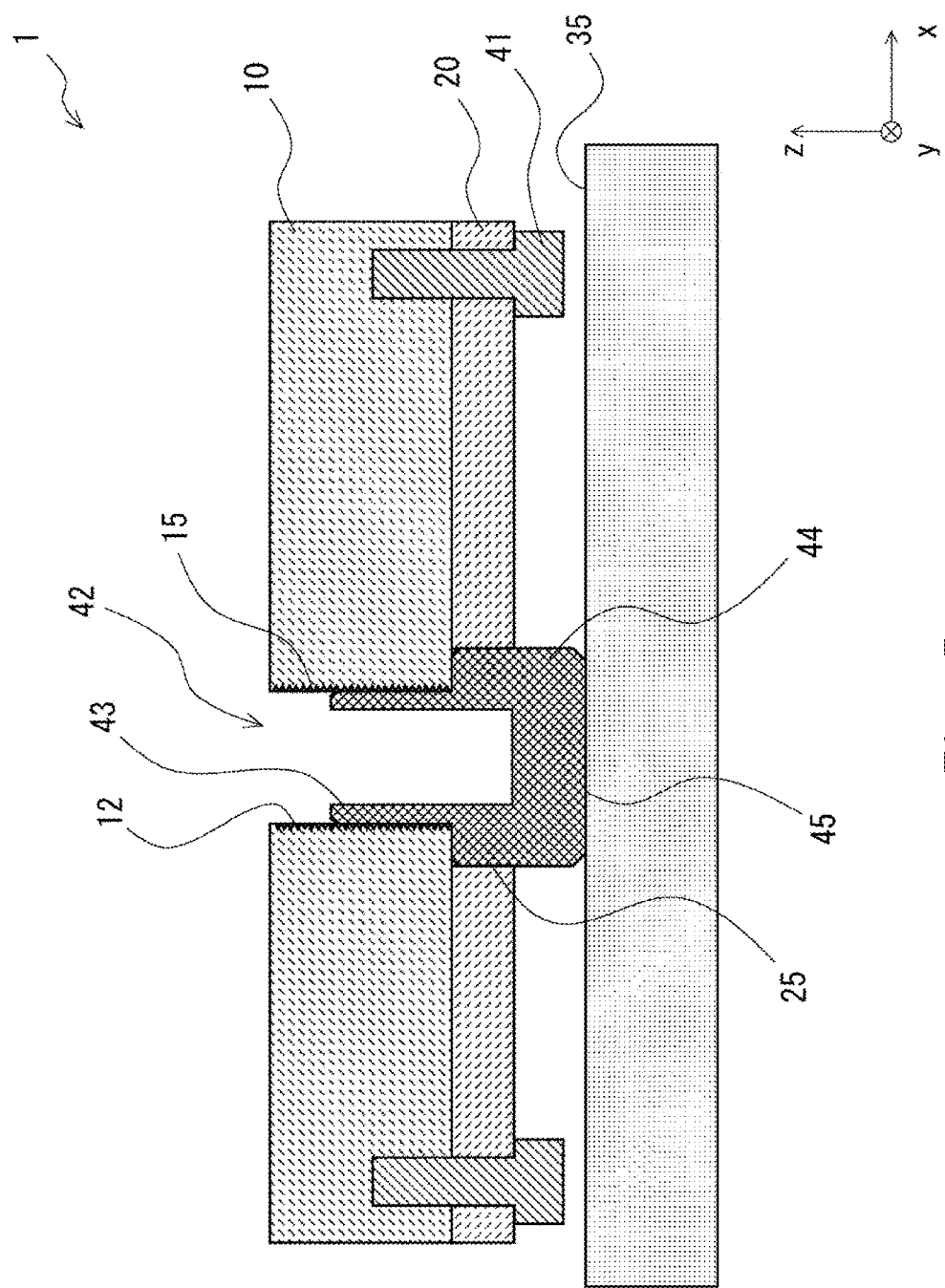
FIG. 5 is a cross-sectional view of the flotation conveyance apparatus according to the first embodiment.

In this embodiment, as shown in FIGS. 4 and 5, the thickness of the lower plate 20 may be configured to be thinner than the thickness of the upper plate 10. When the thickness of the lower plate 20 is made thinner than the thickness of the upper plate 10, if the upper plate 10 and the lower plate 20 are fastened to each other by the plurality of fastening bolts 41 (see FIG. 5), the lower plate 20, which is thinner than the upper plate 10, bends along the surface (the contact surface) of the upper plate 10 at the contact surfaces of the upper plate 10 and the lower plate 20, thereby closing the gap in the contact surfaces of the upper plate 10 and the lower plate 20. It is thus possible to more reliably prevent the leakage of the gas from the contact surfaces of the upper plate 10 and the lower plate 20.

That is, when the thickness of the upper plate 10 is about the same as the thickness of the lower plate 20, the rigidity of the lower plate 20 is increased due to the influence of the thickness, and the upper plate 10 and the lower plate 20 becomes difficult to bend. In this case, it is necessary to make the machining accuracy of the contact surface of the upper plate 10 about the same as that of the lower plate 20 so that a gap is not formed between the contact surfaces of the upper plate 10 and the lower plate 20 at the time of the fastening by bolts.

On the other hand, when the thickness of the lower plate 20 is made thinner than the thickness of the upper plate 10, the thinner lower plate 20 bends along the lower surface (contact surface) of the upper plate 10 at the time of the fastening by bolts, thereby closing the gap between the contact surfaces of the upper plate 10 and the lower plate 20. In this case, since it is not necessary to make the machining accuracy of the contact surface of the upper plate 10 about the same as that of the lower plate 20, the manufacturing process in manufacturing the flotation conveyance apparatus can be simplified.

In the flotation conveyance apparatus 1 according to this embodiment, since it is necessary to increase the surface accuracy of the surface of the flotation conveyance apparatus 1 facing the substrate 30 (i.e., the upper surface of the upper plate 10), it is necessary to increase the thickness of the upper plate 10. Therefore, in this embodiment, it is preferable to increase the thickness of the upper plate 10 and decrease the thickness of the lower plate 20.

Figure 8:
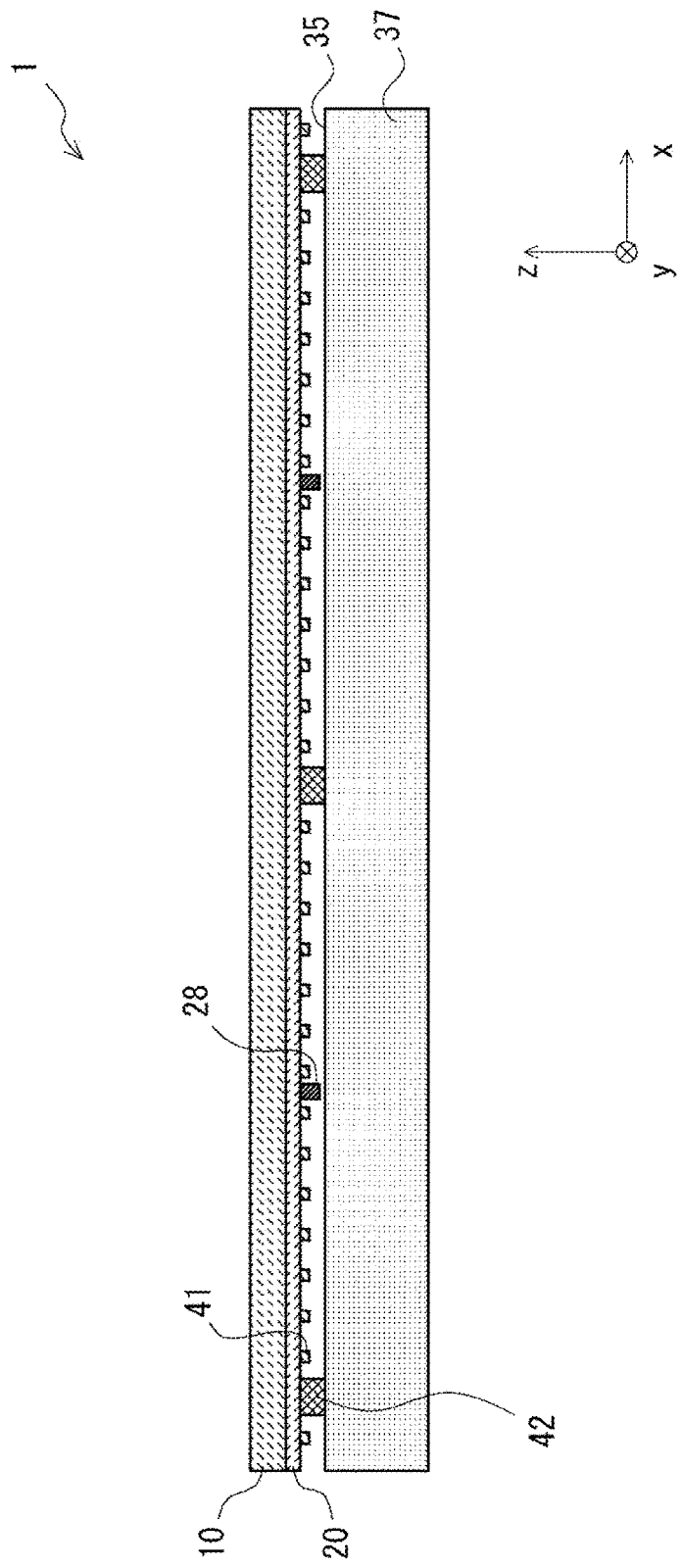
FIG. 8 is a cross-sectional view of the flotation conveyance apparatus according to the first embodiment.

As shown in FIGS. 5 and 8, the plurality of leveling bolts 42 projecting downward from the lower surface of the flotation conveyance apparatus 1 are provided in the flotation conveyance apparatus 1 according to this embodiment. As shown in FIG. 8, in this embodiment, the flotation conveyance apparatus 1 is installed on an installation surface 35 by bringing the plurality of leveling bolts 42 into contact with the installation surface 35. In this manner, by bringing the plurality of leveling bolts 42 into contact with the installation surface 35, the installation accuracy in installing the flotation conveyance apparatus 1 on the installation surface 35 can be improved.

For example, the surface accuracy of the surfaces (contact surfaces 45) of the leveling bolts 42 that are brought into contact with the installation surface 35 may be made higher than the surface accuracy of the lower surface of the lower plate 20. With such a configuration, the flotation conveyance apparatus 1 can be installed on the installation surface 35 more accurately by bringing the contact surfaces 45 of the leveling bolts 42 into contact with the installation surface 35 in order to install the flotation conveyance apparatus 1 than by bringing the lower plate 20 into contact with the installation surface 35 in order to install the flotation conveyance apparatus 1.

That is, when the flotation conveyance apparatus 1 is installed, if the positions that are brought into contact with the installation surface 35 are limited to the contact surfaces 45 of the leveling bolts 42, the installation accuracy of the flotation conveyance apparatus 1 depends on the surface accuracy of the contact surfaces 45. In this case, by ensuring the surface accuracy of the contact surfaces 45 of the leveling bolts 42, the installation accuracy of the flotation conveyance apparatus 1 can be ensured. Therefore, the installation accuracy of the flotation conveyance apparatus 1 can be easily improved. Hereinafter, the leveling bolt will be described in more detail.

As shown in FIG. 5, penetrating holes 12 and 25 into which the leveling bolts 42 are to be disposed are formed in each of the upper plate 10 and the lower plate 20. That is, the penetrating holes 12 of the upper plate 10 and the penetrating holes 25 of the lower plate 20 are formed at positions corresponding to each other when viewed in a plan view (see FIG. 1). When the upper plate 10 and the lower plate 20 are fastened to each other by the fastening bolts 41, each pair of the penetrating holes 12 and 25 become one penetrating hole penetrating the flotation conveyance apparatus 1 in the z-axis direction. The plurality of leveling bolts 42 are arranged in the respective pairs of the penetrating holes 12 and 25.

Although FIGS. 1 to 3 show an example in which six leveling bolts 42 are provided in the flotation conveyance apparatus 1, the number of leveling bolts 42 provided in the flotation conveyance apparatus 1 may be freely determined. As shown in FIG. 8, the number of the leveling bolts 42 is smaller than the number of the fastening bolts 41. That is, the fastening bolts 41 need to be provided at a relatively large number of locations so that there is no gap between the contact surfaces of the upper plate 10 and the lower plate 20. On the other hand, since the leveling bolts 42 are used to install the flotation conveyance apparatus 1 on the installation surface 35, the number of the leveling bolts 42 can be made smaller than the number of the fastening bolts 41.

Figure 6:
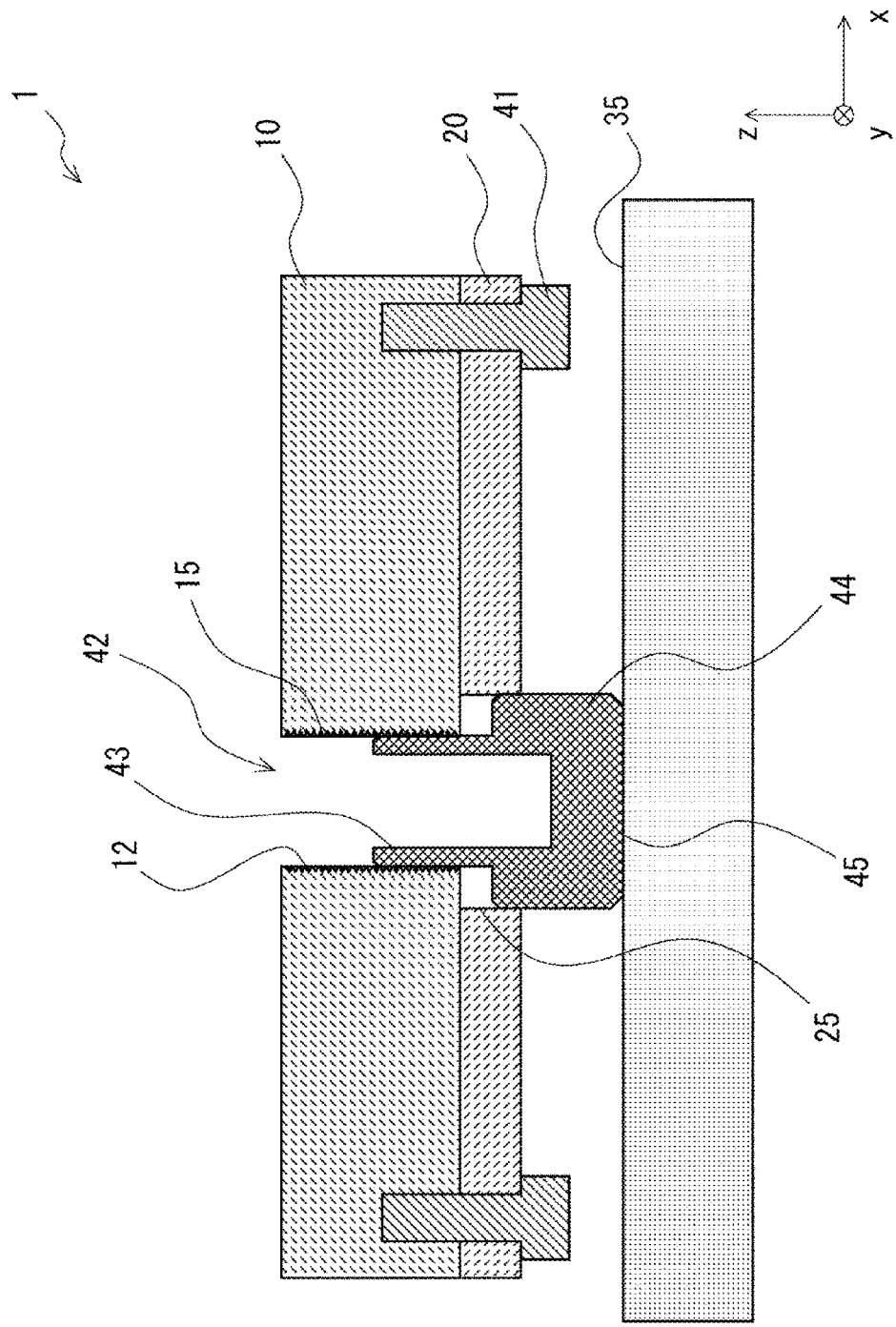
FIG. 6 is a cross-sectional view of the flotation conveyance apparatus according to the first embodiment.

As shown in FIGS. 5 and 6, the leveling bolts 42 are provided in the penetrating holes 12 and 25 and are configured to be displaced inside the penetrating holes 12 and 25 in the up-down direction (z-axis direction), respectively. Specifically, the leveling bolts 42 are configured to be screwed with the upper plate 10. By rotating the leveling bolts 42, the amount of projection of the leveling bolts 42 from the lower surface of the flotation conveyance apparatus 1 can be changed.

That is, as shown in FIG. 5, an inner wall of the penetrating hole 12 is threaded (e.g., subjected to female thread processing. The threaded parts are indicated by the numeral 15). As shown in the perspective view of FIG. 7, a side surface of the leveling bolt 42 on an upper side 43 is also threaded (e.g., subjected to male thread processing). By screwing these threaded parts, the position of the leveling bolt 42 in the up-down direction (z-axis direction) can be changed (adjusted) when the leveling bolt 42 is rotated. Note that, the cross-sectional view of FIG. 6 shows a case in which the leveling bolt 42 projects downward as compared with the case shown in FIG. 5, namely, a case in which the position of the flotation conveyance apparatus 1 is raised.

Figure 7:
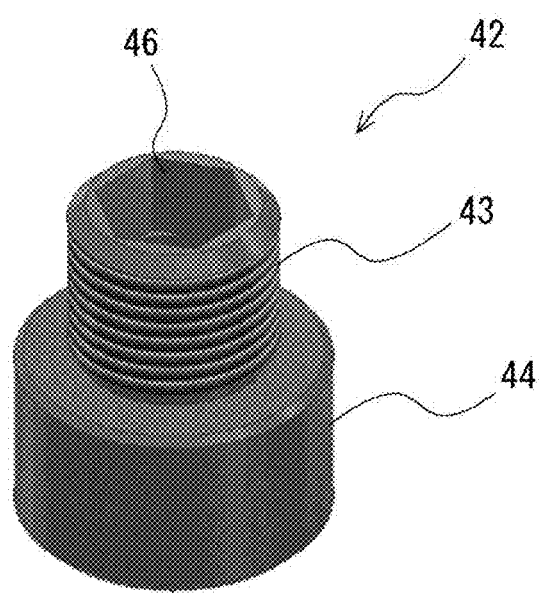
FIG. 7 is a perspective view for explaining a leveling bolt.

As shown in the perspective view of FIG. 7, a fitting part 46 is formed at an upper part of the leveling bolt 42. The fitting part 46 is configured to be fitted to a tool (not shown) introduced from the upper side (the positive side of the z-axis direction) of the flotation conveyance apparatus 1 through the penetrating hole 12. Therefore, by rotating the leveling bolt 42 from the upper side of the flotation conveyance apparatus 1 using the tool (not shown), the amount of projection of the leveling bolt 42 (i.e., the position in the up-down direction) can be changed. With such a configuration, the flotation conveyance apparatus 1 can be easily positioned in the up-down direction. In FIG. 7, although an example in which the fitting part 46 is a hexagonal hole (i.e., the hole is engaged with the hex key) is shown, the shape of the fitting part 46 is not limited to this.

In the flotation conveyance apparatus 1 according to this embodiment, as shown in FIG. 5, the diameter of the penetrating hole 25 formed in the lower plate 20 may be larger than the diameter of the penetrating hole 12 formed in the upper plate 10. With such a configuration, the diameter of a base 44 at a lower side of the leveling bolt 42 can be increased, and the flotation conveyance apparatus 1 can be stabilized when the flotation conveyance apparatus 1 is installed on the installation surface 35.

As shown in FIG. 4, the gas supply ports 27 for supplying the gas to the flow-paths 21 and 22, which are provided on the lower plate 20, are provided in the lower surface of the lower plate 20. As shown in FIG. 8, when the leveling bolts 42 are brought into contact with the installation surface 35 to install the flotation conveyance apparatus 1, a space is formed between the lower surface of the lower plate 20 and the installation surface 35. Pipes 28 may be disposed in this space, and the gas may be supplied to the gas supply ports 27 through these pipes 28. For example, the pipe 28 may be provided to pass through the space between the lower surface of the lower plate 20 and the installation surface 35. The pipes 28 may be connected to penetrating holes (not shown) penetrating an area base 37. In this case, the penetrating holes are connected to the pipes 28 on the upper surface of the area base 37, and the gas supplied to the entrances of the penetrating holes on the lower surface of the area base 37 passes through the penetrating holes of the area base 37 and the pipes 28 and is supplied to the gas supply ports 27.

Figure 9:
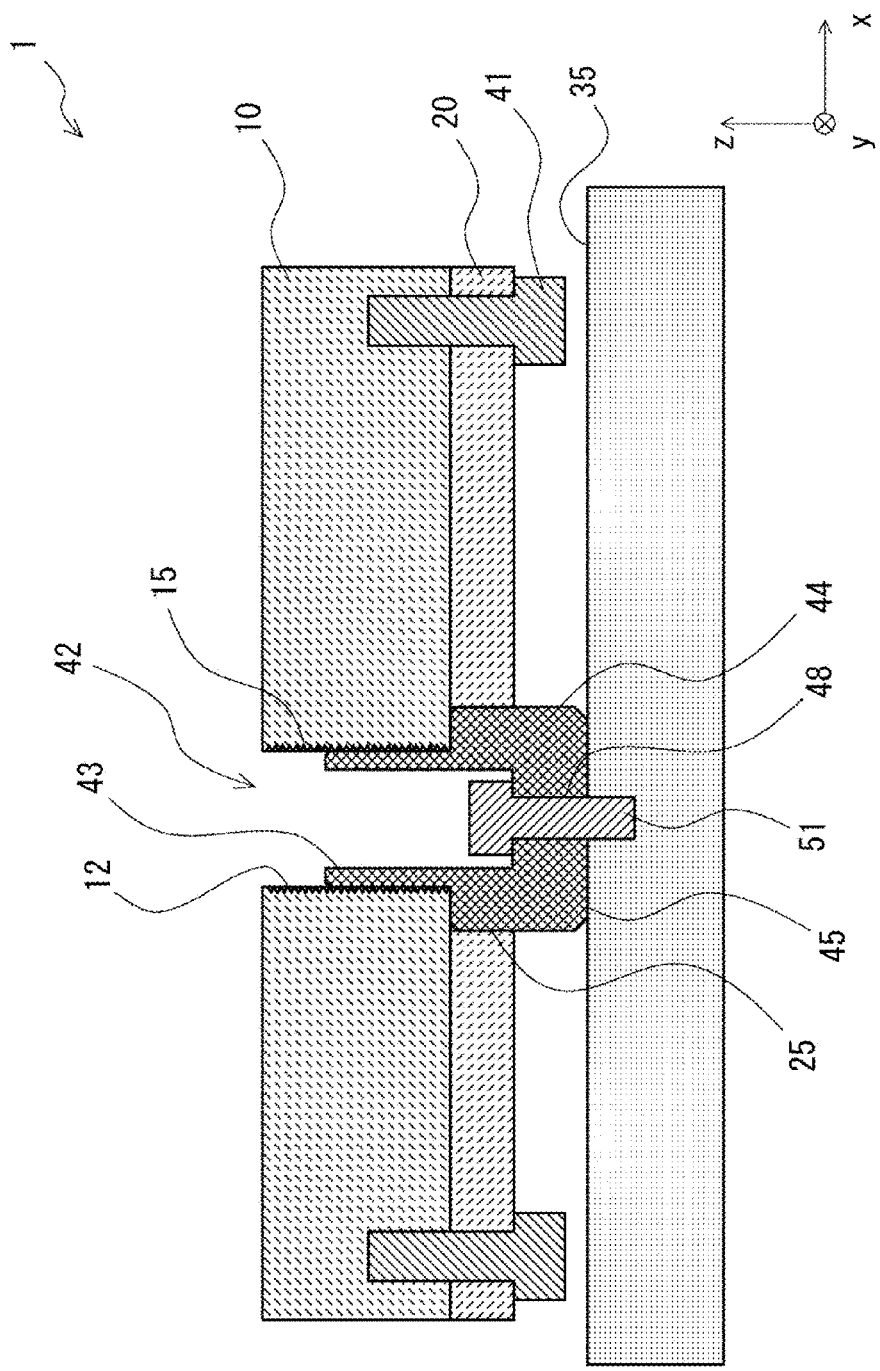
FIG. 9 is a cross-sectional view showing another example of the configuration of the flotation conveyance apparatus according to the first embodiment.

Further, in the flotation conveyance apparatus 1 according to this embodiment, as shown in FIG. 9, a fixing member 51 may be used to fix the leveling bolt 42 to the installation surface 35. By fixing the leveling bolt 42 to the installation surface 35, the flotation conveyance apparatus 1 can be stably installed on the installation surface 35.

Figure 10:
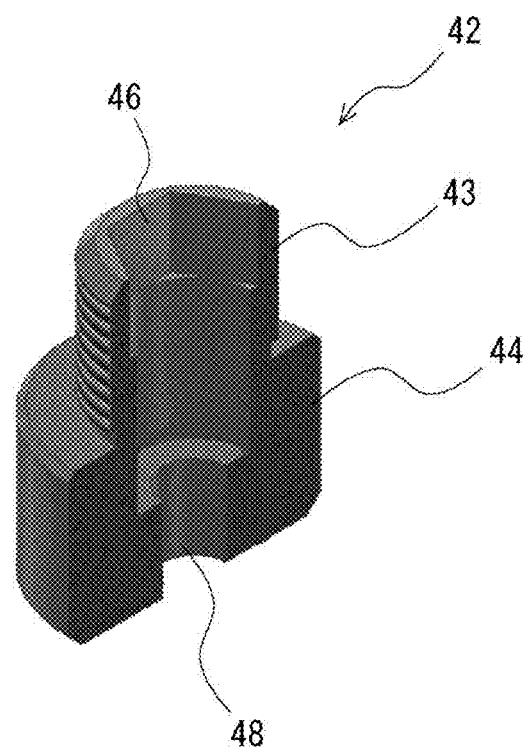
FIG. 10 is a perspective view for explaining a cross-sectional structure of the leveling bolt.

For example, as shown in FIG. 10, a penetrating hole 48 is formed in a center part of the base 44 of the leveling bolt 42. As shown in FIG. 9, by making the fixing member 51 pass through the penetrating hole 48 of the leveling bolt 42 and fixing a distal end of the fixing member 51 to the installation surface 35, the leveling bolt 42 can be fixed to the installation surface 35. When the leveling bolt 42 is fixed to the installation surface 35 using the fixing member 51, a tool may be introduced from the upper side of the flotation conveyance apparatus 1 to fix the fixing member 51. This facilitates the installation work of the flotation conveyance apparatus 1.

In this embodiment, a single flotation unit including the upper plate 10 and the lower plate 20 shown in FIG. 1 may be used to constitute the flotation conveyance apparatus 1, or a plurality of flotation units each including the upper plate 10 and the lower plate 20 shown in FIG. 1 may be combined to constitute the flotation conveyance apparatus 1.

Second Embodiment

Figure 11:
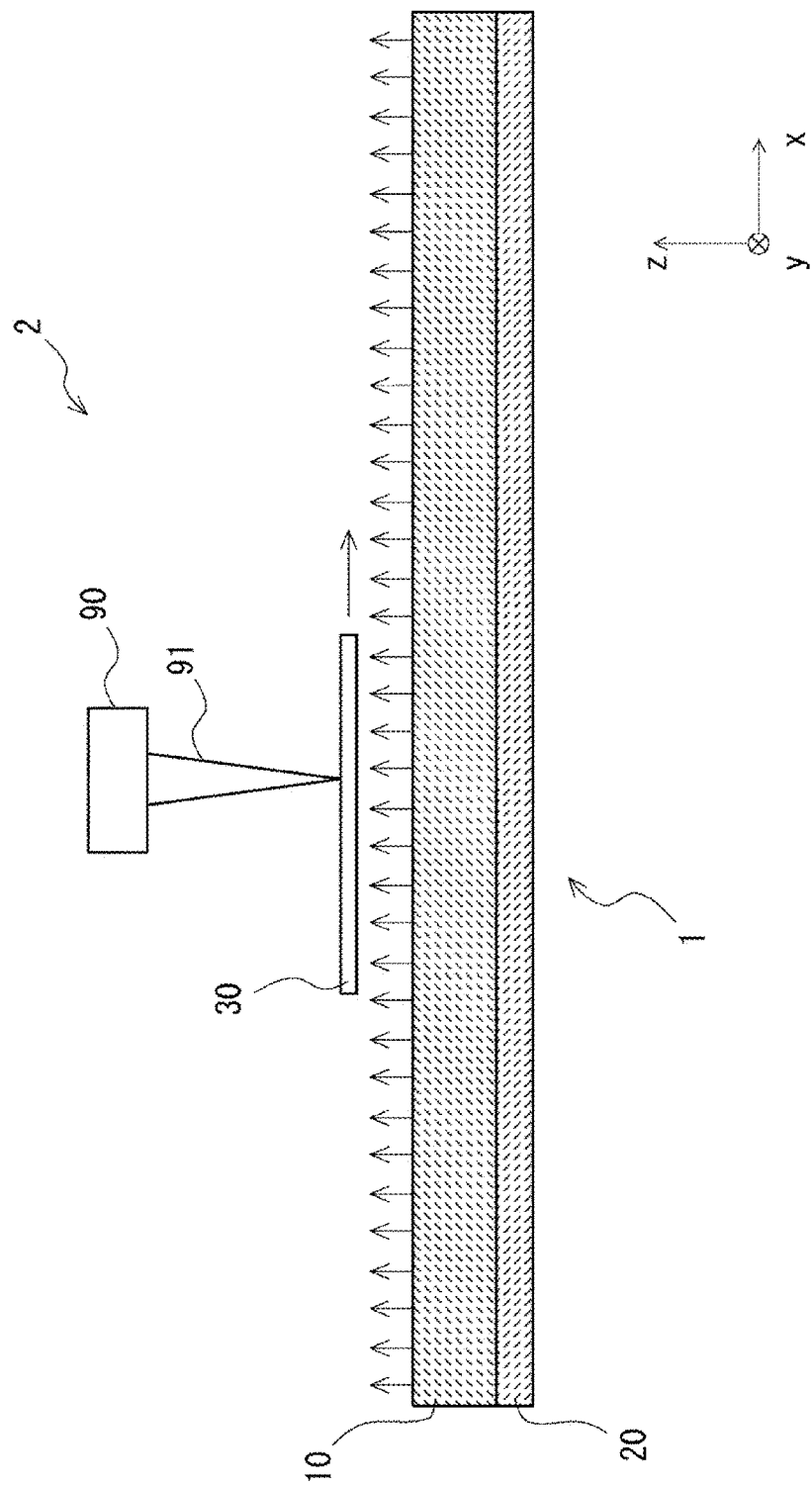
FIG. 11 is a cross-sectional view of a laser processing apparatus according to a second embodiment.

Next, a second embodiment will be described. In the second embodiment, a case in which the flotation conveyance apparatus 1 described in the first embodiment is used in a laser processing apparatus will be described. FIG. 11 is a cross-sectional view of a laser processing apparatus 2 according to the second embodiment. As shown in FIG. 11, the laser processing apparatus 2 includes the flotation conveyance apparatus 1 and a laser generation unit 90.

The flotation conveyance apparatus 1 conveys a substrate 30 in a conveyance direction (a positive side of an x-axis direction) while floating the substrate 30 by ejecting a gas to a lower surface of the substrate 30. Since the flotation conveyance apparatus 1 is the same as the flotation conveyance apparatus described above, the repeated description is omitted.

The laser generation unit 90 generates a laser beam 91 to be applied to a substrate 30. For example, the laser processing apparatus 2 is a laser annealing apparatus, and in this case, an excimer laser or the like may be used for the laser generation unit 90. The laser beam supplied from the laser generation unit 90 is formed into a line shape (a line shape extending in the y-axis direction) in an optical system (not shown). Thus, the laser beam 91 in the line shape, to be more specific, the laser beam 91 whose focus extending in the y-axis direction, is applied to the upper surface of the substrate 30. For example, an amorphous film is formed on the substrate 30, and the amorphous film can be crystallized by irradiating the amorphous film with the laser beam 91 and annealing it.

As described above, the flotation conveyance apparatus 1 is composed of two plates of the upper plate 10 and the lower plate 20. With such a configuration, it is possible to effectively prevent the leakage of the gas from the contact surfaces of the upper plate 10 and the lower plate 20, thereby effectively preventing variations in the flow rate of the gas ejected from the plurality of ejecting ports. It is therefore possible to effectively prevent the variations in the flotation amount of the substrate (variations in the position of the substrate in the up-down direction). Thus, by using the flotation conveyance apparatus 1 in the laser processing apparatus 2, the irradiation accuracy at the time of laser irradiation can be enhanced. Specifically, it is possible to prevent the laser beam from deviating from the Depth of Focus (DOF) of the laser beam applied to the substrate 30 at the time of laser irradiation.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A flotation conveyance apparatus for conveying a substrate while floating the substrate by ejecting a gas to a lower surface of the substrate, the flotation conveyance apparatus comprising:
    an upper plate disposed on the substrate side and including a plurality of ejecting ports for ejecting the gas; and
    a lower plate disposed under the upper plate, wherein
    a plurality of flow-paths for respectively supplying the gas directly to a number of ejecting ports among the plurality of ejecting ports are formed on a surface of the lower plate facing the upper plate, wherein the plurality of flow-paths respectively have varying cross sections, and the plurality of flow-paths extend in an in-plane direction of the lower plate,
    the upper plate and the lower plate are fastened to each other using fastening bolts inserted from the lower plate side,
    a plurality of leveling bolts projecting downward from a lower surface of the flotation conveyance apparatus are provided, and
    the flotation conveyance apparatus is installed on an installation surface by bringing the plurality of leveling bolts into contact with the installation surface.

2. The flotation conveyance apparatus according to claim 1, wherein
    a thickness of the lower plate is configured to be less than a thickness of the upper plate.

3. The flotation conveyance apparatus according to claim 1, wherein a surface accuracy of a contact surface of the leveling bolt is greater than a surface accuracy of a lower surface of the lower plate.

4. The flotation conveyance apparatus according to claim 1, wherein
penetrating holes are formed in the upper plate and the lower plate included in the flotation conveyance apparatus, the leveling bolts being displaceable in an up-down direction inside the respective penetrating holes,
the leveling bolt is configured to be screwed with the upper plate, and
an amount of projection of the leveling bolt from the lower surface of the flotation conveyance apparatus can be changed by rotating the leveling bolt.

5. The flotation conveyance apparatus according to claim 4, wherein
the leveling bolt includes a fitting part to be fitted to a tool introduced from an upper side of the flotation conveyance apparatus through the penetrating hole, and
the amount of projection of the leveling bolt is configured to be changed by rotating the leveling bolt using the tool.

6. The flotation conveyance apparatus according to claim 4, wherein
a diameter of the penetrating hole in the lower plate is larger than a diameter of the penetrating hole in the upper plate.

7. The flotation conveyance apparatus according to claim 1, wherein
a gas supply port for supplying the gas to the plurality of flow-paths is provided in the lower surface of the lower plate, and
the gas is supplied to the gas supply port through a pipe provided in a space formed between the lower surface of the lower plate and the installation surface.

8. A laser processing apparatus comprising:
a flotation conveyance apparatus configured to convey a substrate while floating the substrate by ejecting a gas to a lower surface of the substrate; and
a laser generation unit configured to generate a laser beam to be applied to the substrate, wherein
the flotation conveyance apparatus comprises:
an upper plate disposed on the substrate side including a plurality of ejecting ports for ejecting the gas; and
a lower plate disposed under the upper plate, wherein a plurality of flow-paths for respectively supplying the gas directly to a number of ejecting ports among the plurality of ejecting ports are formed on a surface of the lower plate facing the upper plate, wherein the plurality of flow-paths respectively have varying cross sections, and the plurality of flow-paths extend in an in-plane direction of the lower plate,
the upper plate and the lower plate are fastened to each other using fastening bolts inserted from the lower plate side,
a plurality of leveling bolts projecting downward from a lower surface of the flotation conveyance apparatus are provided, and
the flotation conveyance apparatus is installed on an installation surface by bringing the plurality of leveling bolts into contact with the installation surface.

9. The laser processing apparatus according to claim 8, wherein a thickness of the lower plate is configured to be less than a thickness of the upper plate.

10. The laser processing apparatus according to claim 8, wherein
a surface accuracy of a contact surface of the leveling bolt is greater than a surface accuracy of a lower surface of the lower plate.

11. The laser processing apparatus according to claim 8, wherein
penetrating holes are formed in the upper plate and the lower plate included in the flotation conveyance apparatus, the leveling bolts being displaceable in an up-down direction inside the respective penetrating holes,
the leveling bolt is configured to be screwed with the upper plate, and
an amount of projection of the leveling bolt from the lower surface of the flotation conveyance apparatus can be changed by rotating the leveling bolt.

12. The laser processing apparatus according to claim 11, wherein
the leveling bolt includes a fitting part to be fitted to a tool introduced from an upper side of the flotation conveyance apparatus through the penetrating hole, and
the amount of projection of the leveling bolt is configured to be changed by rotating the leveling bolt using the tool.

13. The laser processing apparatus according to claim 11, wherein
a diameter of the penetrating hole in the lower plate is larger than a diameter of the penetrating hole in the upper plate.

14. The laser processing apparatus according to claim 8, wherein
a gas supply port for supplying the gas to the plurality of flow-paths is provided in the lower surface of the lower plate, and
the gas is supplied to the gas supply port through a pipe provided in a space formed between the lower surface of the lower plate and the installation surface.

\* \* \* \* \*